US009806219B2

United States Patent
Benson et al.

(10) Patent No.: US 9,806,219 B2
(45) Date of Patent: Oct. 31, 2017

(54) DISPLAYS WITH CAMERA WINDOW OPENINGS

(71) Applicant: Apple Inc., Cupertino, CA (US)

(72) Inventors: Eric L. Benson, San Francisco, CA (US); Bryan W. Posner, La Selva Beach, CA (US); Christopher L. Boitnott, Half Moon Bay, CA (US); Dinesh C. Mathew, Fremont, CA (US); Jun Qi, Cupertino, CA (US); Robert Y. Cao, San Francisco, CA (US); Victor H. Yin, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 95 days.

(21) Appl. No.: 14/151,253

(22) Filed: Jan. 9, 2014

(65) Prior Publication Data

US 2014/0225131 A1     Aug. 14, 2014

Related U.S. Application Data

(60) Provisional application No. 61/764,668, filed on Feb. 14, 2013.

(51) Int. Cl.
*H01L 31/12* (2006.01)
*H01L 31/18* (2006.01)
(Continued)

(52) U.S. Cl.
CPC ............ *H01L 31/12* (2013.01); *G06F 1/1643* (2013.01); *G06F 1/1686* (2013.01); *G06F 3/041* (2013.01);
(Continued)

(58) Field of Classification Search
CPC ......... G02F 1/133512; G02F 1/133514; G02F 1/1362; G02F 2001/133388;
(Continued)

(56) References Cited

U.S. PATENT DOCUMENTS

| 4,814,296 A | 3/1989 | Jedlicka et al. |
| 6,118,665 A * | 9/2000 | Kishida ................. H05K 3/361 |
| | | 174/117 F |

(Continued)

FOREIGN PATENT DOCUMENTS

| CN | 202729991 | 2/2013 |
| KR | 101032942 | 5/2011 |

(Continued)

OTHER PUBLICATIONS

Hassan et al., U.S. Appl. No. 13/656,267, filed Oct. 19, 2012.
Hassan, U.S. Appl. No. 13/723,130, filed Dec. 20, 2012.
Gupta et al., U.S. Appl. No. 61/745,117, filed Dec. 21, 2012.

*Primary Examiner* — Marcos D Pizarro
*Assistant Examiner* — Benjamin Tzu-Hung Liu
(74) *Attorney, Agent, or Firm* — Treyz Law Group, P.C.; G. Victor Treyz; Zachary D. Hadd

(57) ABSTRACT

A display may include a color filter layer, a liquid crystal layer, and a thin-film transistor layer. A camera window may be formed in the display to accommodate a camera. The camera window may be formed by creating a notch in the thin-film transistor layer that extends inwardly from the edge of the thin-film transistor layer. The notch may be formed by scribing the thin-film transistor layer around the notch location and breaking away a portion of the thin-film transistor layer. A camera window may also be formed by grinding a hole in the display. The hole may penetrate partway into the thin-film transistor layer, may penetrate through the transistor layer but not into the color filter layer, or may pass through the thin-film transistor layer and partly into the color filter layer.

18 Claims, 15 Drawing Sheets

(51) Int. Cl.
   *G06F 1/16*     (2006.01)
   *G06F 3/041*    (2006.01)
   G02F 1/1335     (2006.01)
   G02F 1/1362     (2006.01)
   G02F 1/1333     (2006.01)

(52) U.S. Cl.
   CPC ............ H01L 31/18 (2013.01); *G02F 1/1362* (2013.01); *G02F 1/133512* (2013.01); *G02F 1/133514* (2013.01); *G02F 2001/133388* (2013.01); *G02F 2201/58* (2013.01)

(58) Field of Classification Search
   CPC .. G02F 2201/58; G06F 1/1643; G06F 1/1686; G06F 3/041; H01L 31/12; H01L 31/18; H01L 51/5237; H01L 51/5271
   See application file for complete search history.

(56) References Cited

U.S. PATENT DOCUMENTS

| | | |
|---|---|---|
| 6,612,910 B1 | 9/2003 | Hirano et al. |
| 8,369,702 B2 | 2/2013 | Sanford et al. |
| 8,467,177 B2 | 6/2013 | Mathew et al. |
| 8,482,713 B2 | 7/2013 | Qi et al. |
| 8,611,077 B2 | 12/2013 | Sanford et al. |
| 2003/0145624 A1 | 8/2003 | Luettgens et al. |
| 2007/0188688 A1 | 8/2007 | Hwang et al. |
| 2007/0195255 A1* | 8/2007 | Cho ................... G02F 1/1339 349/153 |
| 2008/0198320 A1 | 8/2008 | Chwu et al. |
| 2009/0049773 A1 | 2/2009 | Zadesky et al. |
| 2009/0257189 A1 | 10/2009 | Wang et al. |
| 2010/0171918 A1* | 7/2010 | Saitou et al. ............. 349/149 |
| 2010/0315570 A1* | 12/2010 | Mathew ............. G06F 1/1637 349/58 |
| 2011/0267534 A1* | 11/2011 | Tsai .................. H04N 5/2257 348/374 |
| 2012/0020000 A1 | 1/2012 | Mathew et al. |
| 2012/0020002 A1 | 1/2012 | Mathew et al. |
| 2012/0020700 A1 | 1/2012 | Yamada et al. |
| 2012/0050975 A1 | 3/2012 | Garelli et al. |
| 2012/0069241 A1* | 3/2012 | Shiau ................. G06F 1/1686 348/373 |
| 2012/0105400 A1 | 5/2012 | Mathew et al. |
| 2012/0200480 A1 | 8/2012 | Qi et al. |
| 2012/0327325 A1* | 12/2012 | Park et al. ................. 349/58 |

FOREIGN PATENT DOCUMENTS

| | | |
|---|---|---|
| TW | 200835956 | 9/2008 |
| TW | 201224634 | 6/2012 |

* cited by examiner

DISPLAYS WITH CAMERA WINDOW OPENINGS

This application claims priority to U.S. provisional patent application No. 61/764,668 filed Feb. 14, 2013, which is hereby incorporated by reference herein in its entirety.

BACKGROUND

This relates to electronic devices and, more particularly, to electronic devices with optical devices such as cameras.

Electronic devices such as portable computers and cellular telephones often have cameras. Cameras may be used to take still images and may be used to support video features such as video calls.

In a cellular telephone with a camera, the camera may be mounted under a portion of a cover glass layer in the display of the cellular telephone. Black ink may be printed under the cover glass to hide the camera from view. An opening may be formed in the black ink to form a window for the camera.

In a portable computer, a camera may be mounted along the upper edge of the display. In a typical arrangement, the display may be mounted within the housing of the portable computer using a bezel. An opening may be provided in the bezel to form a window for the camera or a camera may be located under an opening in a black ink border region.

Camera mounting arrangements such as these may not be satisfactory in device configurations where space is at a premium. For example, mounting arrangements in which a camera is attached to the lower surface of a display may consume more interior space in a device than is desired.

It would therefore be desirable to be able to provide improved camera and display structures for electronic devices.

SUMMARY

An electronic device may be provided with a display mounted in a housing. The display may include a color filter layer, a liquid crystal layer, and a thin-film transistor layer. Polarizers may be formed above and below the color filter layer and the thin-film transistor layer, respectively.

The color filter layer may form the outermost layer of the display. A camera window may be formed in the display to accommodate a camera. An opaque masking layer may be formed in an inactive border region along the edge of the display. The opaque masking layer may have an opening that is aligned with the camera window to allow light to pass through the opaque masking layer to the camera.

The camera window may be formed by creating a notch in the thin-film transistor layer that extends inwardly from the edge of the thin-film transistor layer. The notch may be formed by scribing the thin-film transistor layer around the notch location and breaking away a portion of the thin-film transistor layer. A scribe wheel or laser scribing equipment may be used in creating scribe lines for the notch. The color filter layer may have a polished edge that is aligned with a polished edge of the thin-film transistor layer. The color filter layer may overlap the notch.

A camera window may also be formed by grinding a hole in the display using grinding equipment. The hole may penetrate partway into the thin-film transistor layer, may penetrate through the transistor layer but not into the color filter layer, or may pass through the thin-film transistor layer and partly into the color filter layer.

The camera may be mounted in the recess or hole in the display and may be aligned with the opening in the opaque masking layer.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Cameras may be used to capture images. The cameras may be mounted in alignment with camera windows in the displays. Illustrative electronic devices that may be provided with displays having camera windows are shown in FIGS. 1, 2, 3, and 4.

Figure 1:
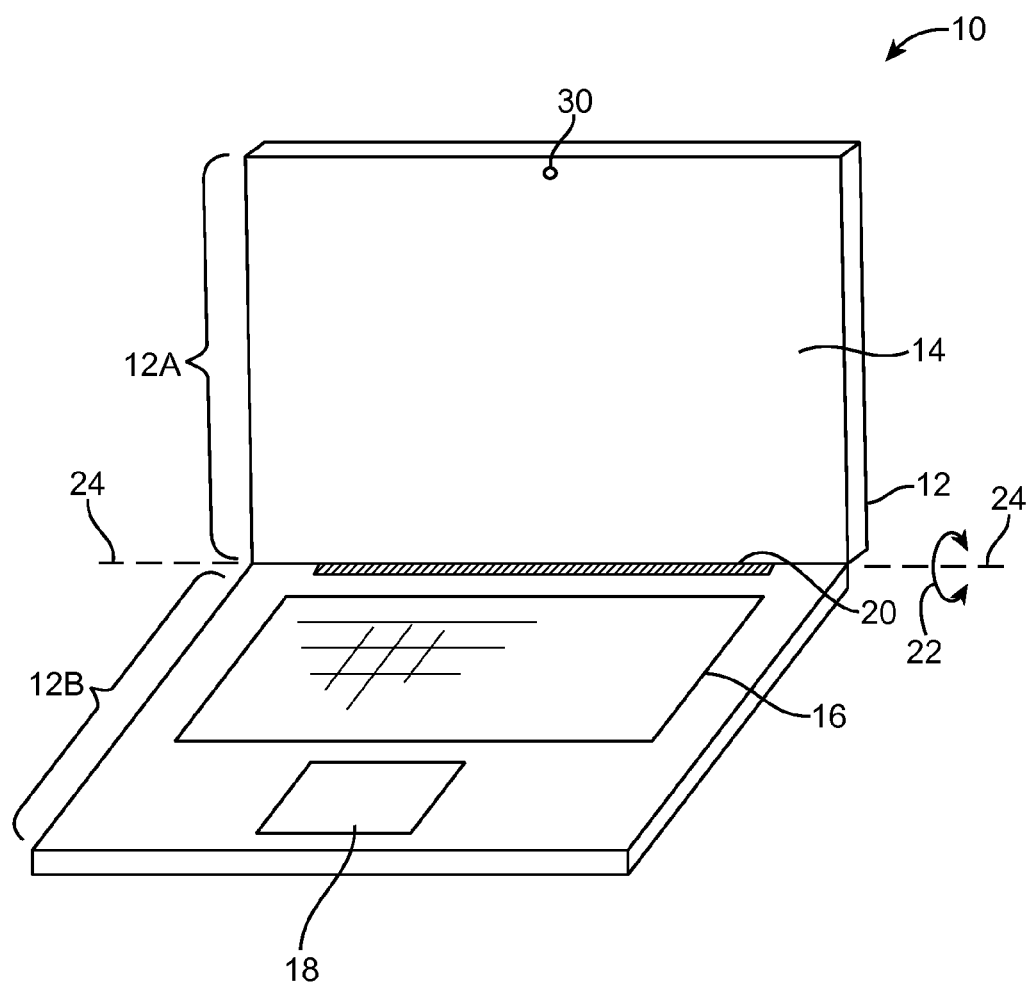
FIG. 1 is a perspective view of an illustrative electronic device such as a laptop computer with a display that has a camera window in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24. Camera window 30 may be formed along the upper edge of display 14 or elsewhere on display 14.

Figure 2:
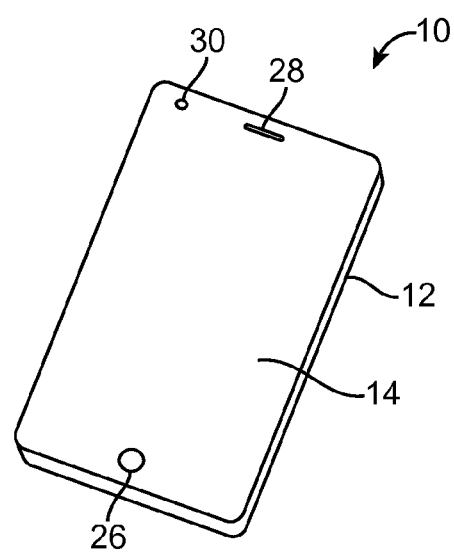
FIG. 2 is a perspective view of an illustrative electronic device such as a handheld electronic device with a display that has a camera window in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2). Camera window 30 may be formed adjacent to speaker port 28 or elsewhere on display 14.

Figure 3:
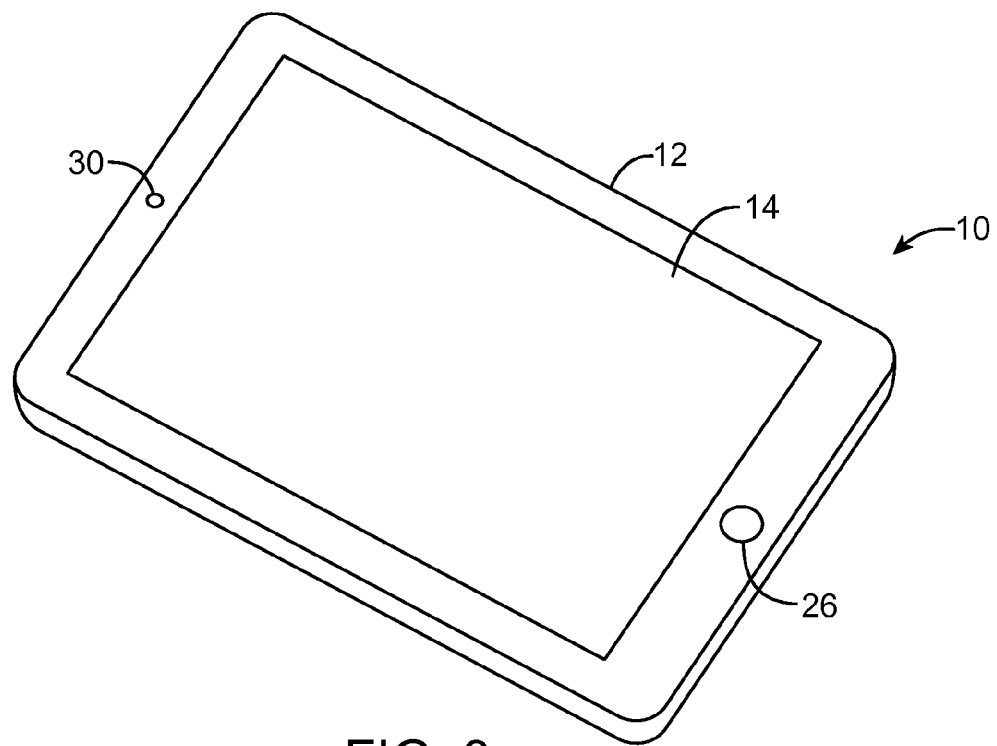
FIG. 3 is a perspective view of an illustrative electronic device such as a tablet computer with a display that has a camera window in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example). Camera window 30 may be formed on an opposing edge of display 14 or may be formed elsewhere on display 14.

Figure 4:
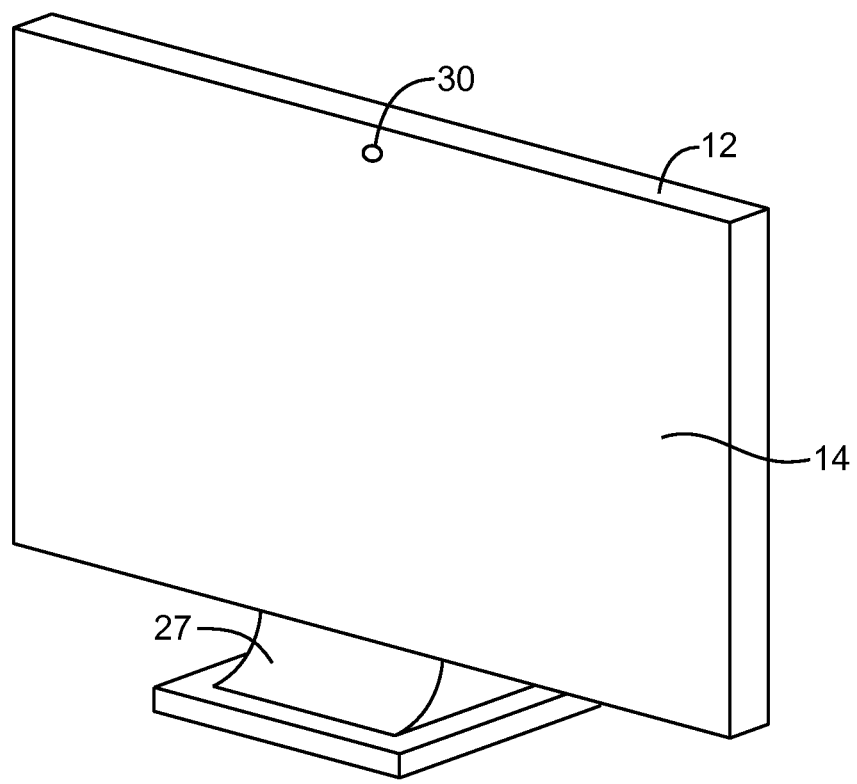
FIG. 4 is a perspective view of an illustrative electronic device such as a computer display with display structures having a camera window in accordance with an embodiment of the present invention.

FIG. 4 shows how electronic device 10 may be a computer display or a computer that has been integrated into a computer display. With this type of arrangement, housing 12 for device 10 may be mounted on a support structure such as stand 27. Display 14 may be mounted on a front face of housing 12. Camera window 30 may be formed along the upper edge of display 14 or elsewhere on display 14.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components or other suitable image pixel structures.

A display cover layer may cover the surface of display 14 or a display layer such as a color filter layer or other portion of a display may be used as the outermost (or nearly outermost) layer in display 14. The outermost display layer may be formed from a transparent glass sheet, a clear plastic layer, or other transparent member. An advantage of forming display 14 without a cover layer is that this type of configuration may be thinner than configurations in which a display cover layer is present. Configurations for display 14 in which no display cover layer is present are sometimes described herein as an example.

Device 10 may include optical sensors such as light-based proximity sensors and ambient light sensors, status indicator lights, cameras, and other optical components. These components may be mounted under a window in display 14 such as window 30 (i.e., window 30 may form an optical device window). Configurations in which window 30 is a camera window and in which a camera is mounted in alignment with window 30 are sometimes described herein as an example.

Figure 5:
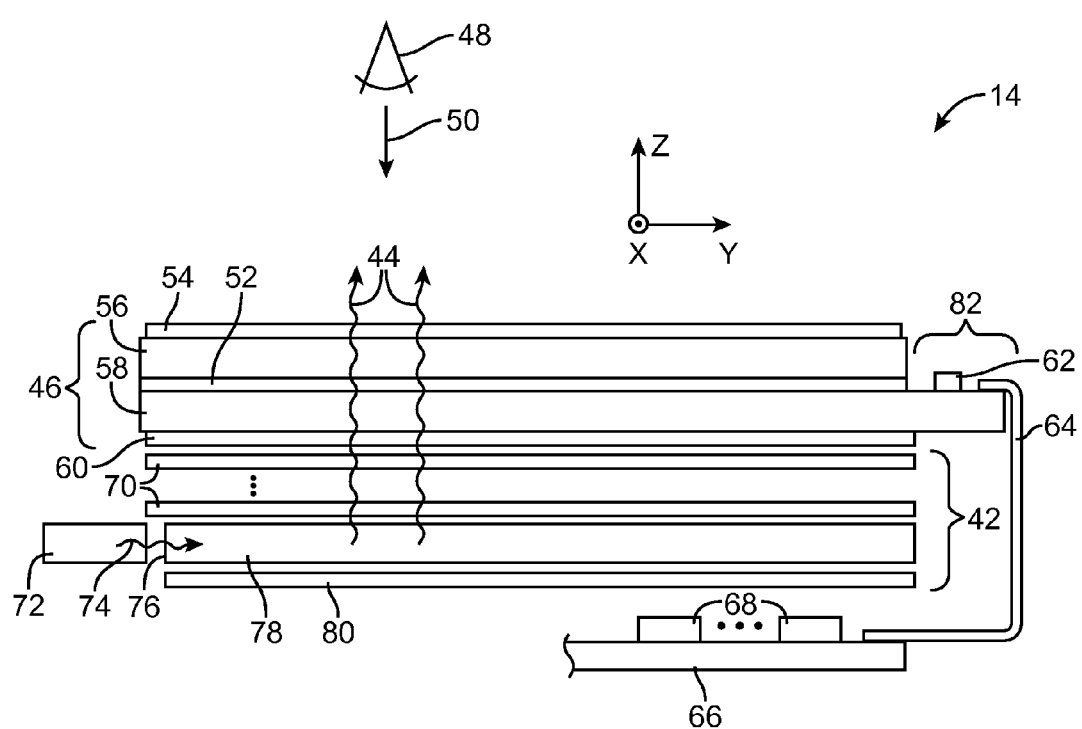
FIG. 5 is a cross-sectional side view of an illustrative display in accordance with an embodiment of the present invention.

A cross-sectional side view of an illustrative configuration for display 14 of device 10 (e.g., for display 14 of the devices of FIG. 1, FIG. 2, FIG. 3, FIG. 4 or other suitable electronic devices) is shown in FIG. 5. As shown in FIG. 5, display 14 may include backlight structures such as backlight unit 42 for producing backlight 44. During operation, backlight 44 travels outwards (vertically upwards in dimension Z in the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52.

Liquid crystal layer 52 may be interposed between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer.

During operation of display 14 in device 10, control circuitry (e.g., one or more integrated circuits such as components 68 on printed circuit 66 of FIG. 5) may be used to generate information to be displayed on display (e.g., display data). The information to be displayed may be conveyed from circuitry 68 to display driver integrated circuit 62 using a signal path such as a signal path formed from conductive metal traces in flexible printed circuit 64 (as an example).

Display driver integrated circuit 62 may be mounted on thin-film-transistor layer driver ledge 82 or elsewhere in device 10. A flexible printed circuit cable such as flexible printed circuit 64 may be used in routing signals between printed circuit 66 and thin-film-transistor layer 58. If desired, display driver integrated circuit 62 may be mounted on printed circuit 66 or flexible printed circuit 64. Printed circuit 66 may be formed from a rigid printed circuit board (e.g., a layer of fiberglass-filled epoxy) or a flexible printed circuit (e.g., a flexible sheet of polyimide or other flexible polymer layer).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint in the X-Y plane of FIG. 5, optical films 70 and reflector 80 may have a matching rectangular footprint.

Figure 6:
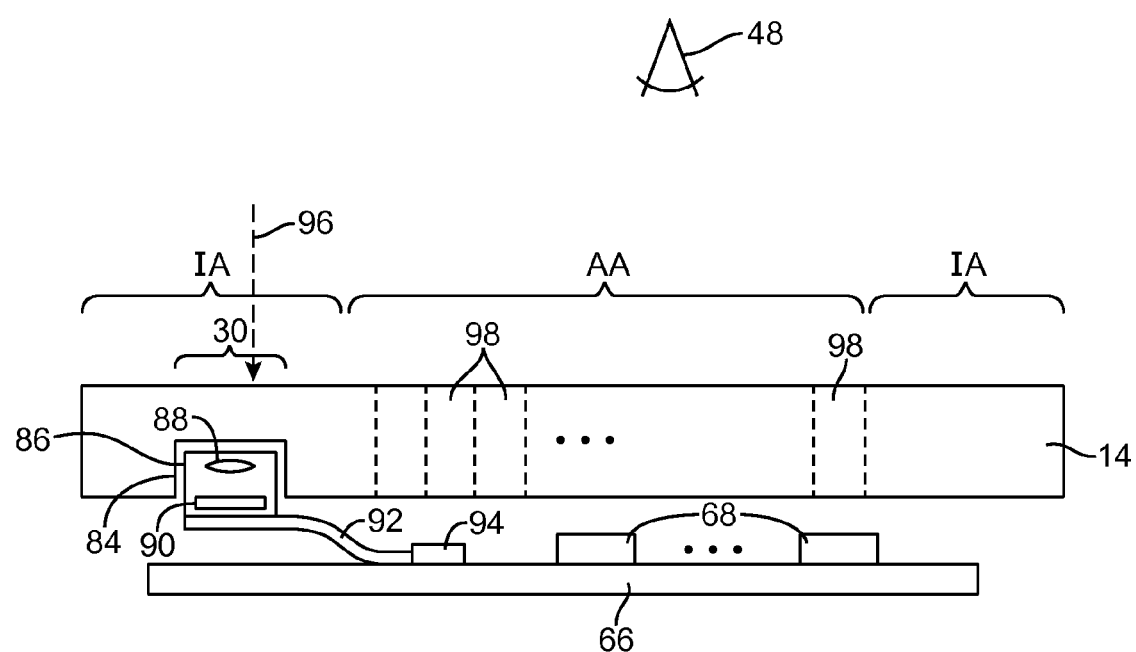
FIG. 6 is a cross-sectional side view of an illustrative display having an opening that accommodates a camera in accordance with an embodiment of the present invention.

As shown in FIG. 6, display 14 may be characterized by an active area such as active area AA. Active area AA may include an array of display pixels 98. Display pixels 98 may be used in displaying images to viewer 48 during operation of device 10. An inactive border region such as inactive area IA may surround the periphery of active area AA. For example, active area AA may have a rectangular shape surrounded by four peripheral edges and inactive region IA may have the shape of a rectangular ring that runs along each of the four peripheral edges of active area AA and thereby surrounds active area AA.

Camera window 30 may be formed by creating an opening in one or more of the layers of display 14 such as opening 84. Opening 84 may be formed along the edge of display 14 (i.e., opening 84 may be a notch in the edge of display 14 that extends inwardly from an edge of the display and that passes partway through display 14) or may a hole that passes partway through display 14 (as shown in the FIG. 6 example).

An optical component such as camera 86 may be mounted within window opening 84. Camera 86, which may sometimes be referred to as a camera module, may be formed from a plastic housing or other housing structure that encloses components such as lens structures 88 and digital image sensor 90. During operation, light 96 may pass through camera window 30. Lens structures 88 may include one or more lenses formed from glass or plastic. Lens structures 88 may focus light 96 onto digital image sensor 90. Digital image sensor 90 may be coupled to components 68 on a substrate such as substrate 66 using a communications path such as communications path 92. Communications path 92 may be a flexible printed circuit (e.g., a layer of polyimide or other flexible polymer substrate with metal traces that form a signal bus for a flexible printed circuit cable) or may be formed from other structures. A connector such as connector 94 (e.g., a board-to-board connector) may be used in coupling flexible printed circuit cable 92 to substrate 66. Circuitry 68 may include processors for processing image data from camera 86 and other circuitry.

The presence of an opening such as opening 84 that passes partly through the layers of display 14 may help accommodate camera 86. For example, some or all of camera 86 may protrude into opening 84 as shown in FIG. 6, which reduces or eliminates the volume consumed by camera outside of the layers of display 14. By mounting components in device 10 efficiently, the size of device 10 can be minimized and/or space may be made available within device 10 for other components.

Figure 7:
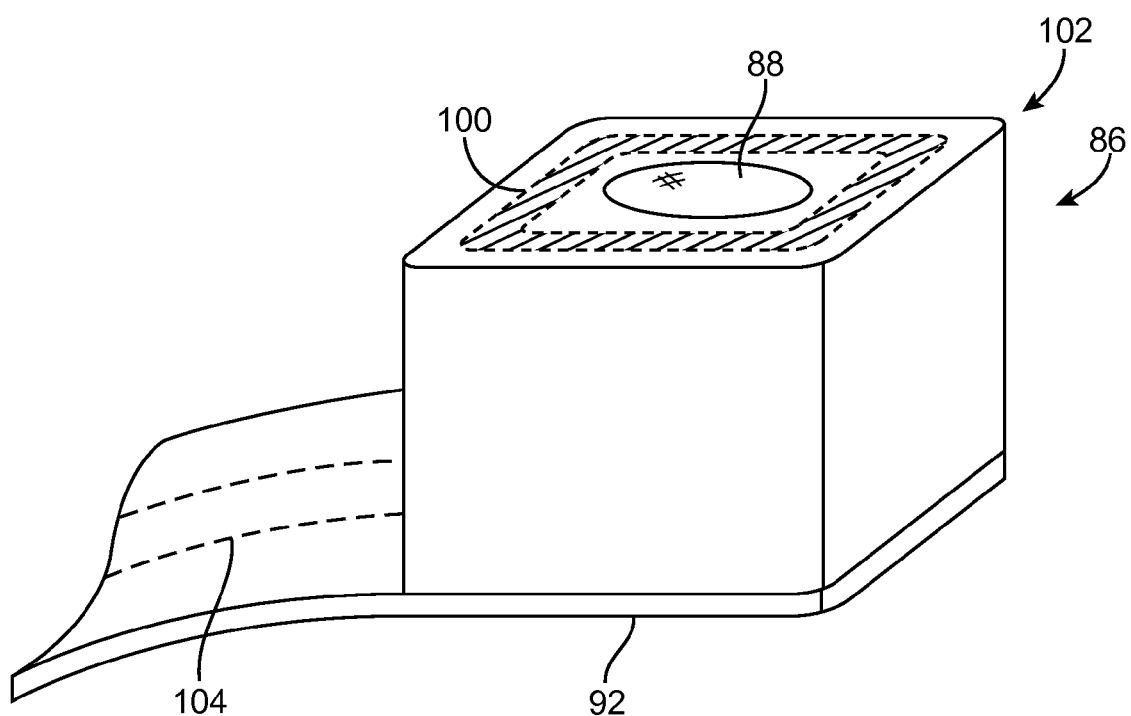
FIG. 7 is a perspective view of a camera mounted to a flexible printed circuit cable in accordance with an embodiment of the present invention.

FIG. 7 is a perspective view of camera 86 showing how the housing for camera 86 may have a rectangular box shape with rounded corners 102 (as an example). Other shapes may be used for the camera housing if desired (e.g., cylindrical shapes with circular portions that fit within corresponding circular holes 84, shapes with right-angle corners, etc.). Camera 86 may be soldered or otherwise mounted on flexible printed circuit 92. Flexible printed circuit 92 may include metal traces such as traces 104. Traces 104 may be used in conveying power and data signals between camera

86 and circuitry 68 on substrate 66. A ring of adhesive such as adhesive 100 may surround lens structures 88 on the upper surface of camera 86. Adhesive 100 may be used in attaching camera 86 within recess 84 in display 14. Screws and other fasteners, solder, welds, clips, mounting brackets, and other structures may also be used in mounting camera 86 if desired.

Figure 8:
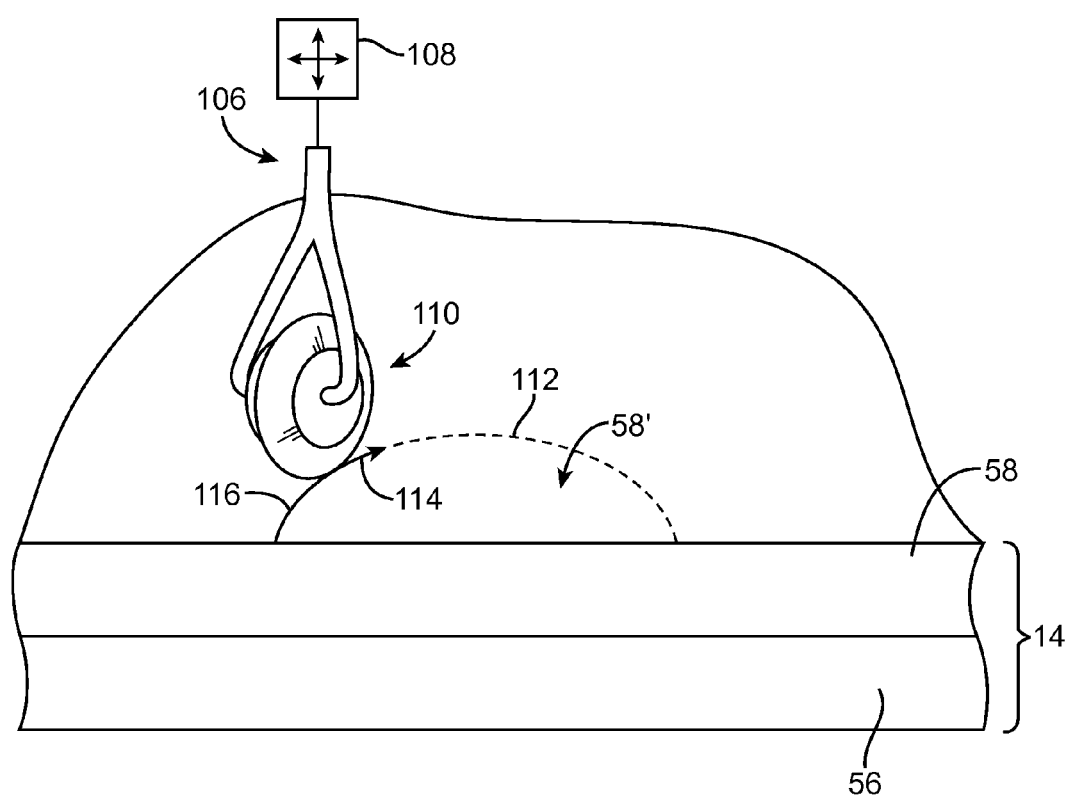
FIG. 8 is a perspective view of display layers in a display panel showing how an opening may be formed by scribing a portion of the display panel with a computer-controlled scribing wheel in accordance with an embodiment of the present invention.

FIG. 8 is a perspective view of layers in display 14 during formation of a display camera window opening using a scribing tool. As shown in FIG. 8, the display panel for display 14 may include scribing equipment such as equipment 106. Equipment 106 may include a computer-controlled positioner such as positioner 108 that controls the position of scribing wheel 110. Scribing wheel 110 may be carbide glass cutting wheel, a diamond scribing wheel, or other scribing wheel. Using positioner 108, wheel 110 may be moved in direction 114 along path 112, thereby creating scribe line 116. The shape of scribe line 116 defines the shape of the camera window opening being formed.

After scribe line 116 has been formed, portion 58' of layer 58 may be removed to form opening 84 by breaking portion 58' away from the remainder of layer 58 along scribe line 116. In the example of FIG. 8, the shape of the scribe line is curved and the resulting shape of removable portion 58' is semicircular (i.e., the process of scribing and removing portion 58' from thin-film-transistor layer 58 forms a semicircular camera window notch 84 for camera window 30). Other scribe line shapes and resulting camera window opening shapes may be formed if desired (e.g., shapes with straight edges, shapes with straight edges with curved corners, shapes with curved edges, shapes with a combination of curved and straight edges, etc.).

Figure 9:
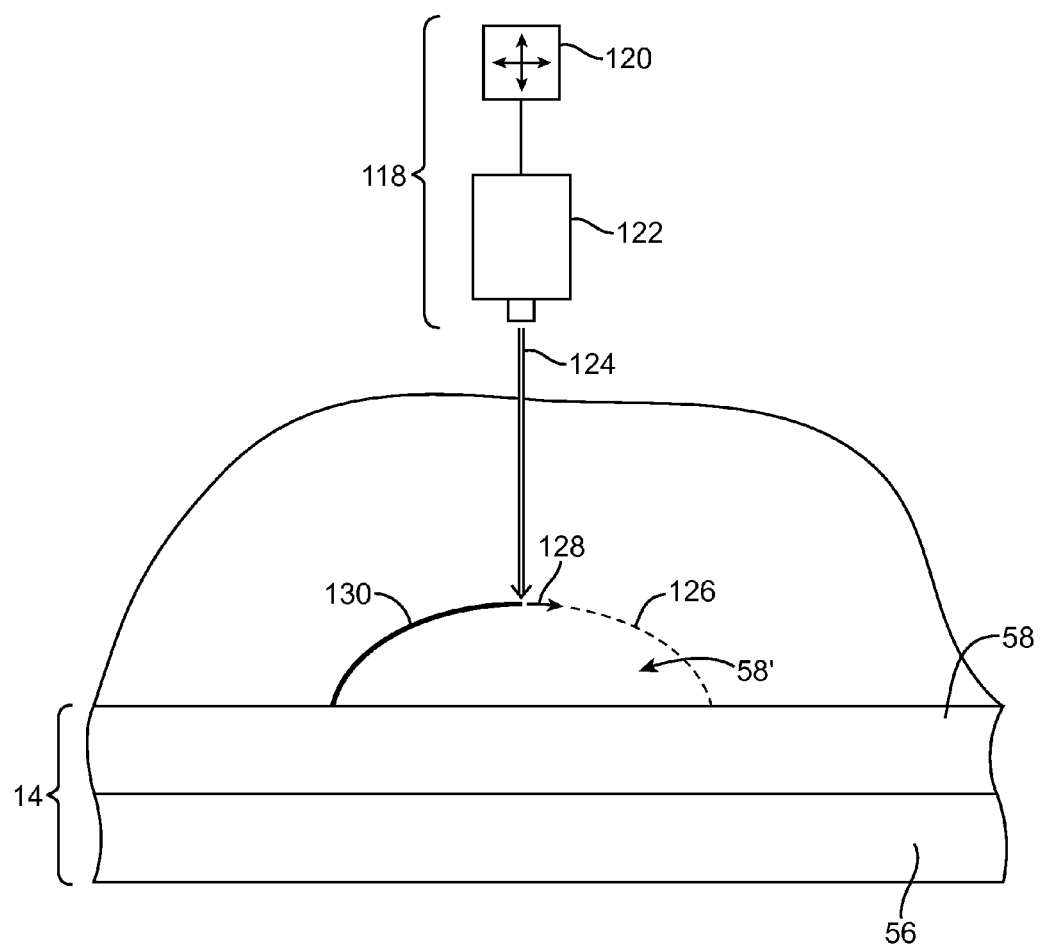
FIG. 9 is a perspective view of display layers in a display panel showing how an opening may be formed by scribing a portion of the display panel with a computer-controlled laser in accordance with an embodiment of the present invention.

If desired, laser-based scribing equipment may be used in removing portion 58' of thin-film transistor layer 58 in display 14. As shown in FIG. 9, laser-based scribing equipment 118 may include computer-controlled positioner 120. Computer-controlled positioner 120 may control the position of laser 122. During operation, laser 122 produces laser beam 124. Positioner 120 moves laser beam 124 in direction 128 along path 126. As shown in FIG. 9, this creates scribe line 130 around portion 58' of thin-film transistor layer 58. As with the wheel-based scribing technique of FIG. 8, portion 58' of layer 58 may be removed to form opening 84 by breaking portion 58' away from the remainder of layer 58 along scribe line 130 following completion of scribe line 130 by laser-based scribing equipment 118. The shape of scribe line 130 and the associated shape of the resulting notch for the camera window opening formed by removing portion 58' may be semicircular, may have straight edges, may have curved edges, may have a combination of straight and curved edges, etc.

Figure 10:
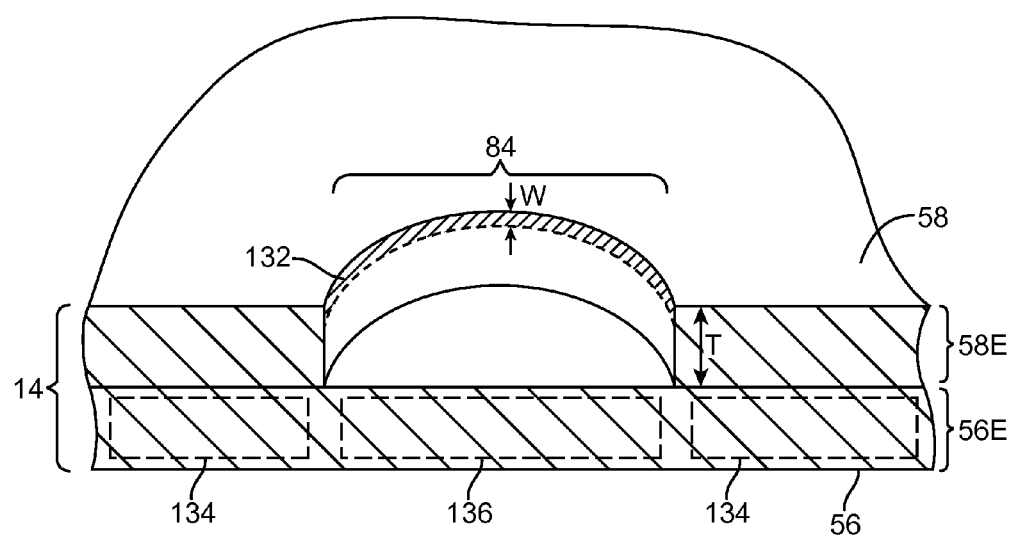
FIG. 10 is a perspective view of a display panel in which a portion of a thin-film transistor layer has been removed using wheel-based or laser-based scribing techniques in accordance with an embodiment of the present invention.

Following scribing of thin-film transistor layer 58 using wheel based scribing equipment 106 of FIG. 8, using laser-based scribing equipment 118, or using other scribing equipment, a camera window opening such as camera window notch 84 of FIG. 10 may be created in thin-film transistor layer 58. Scribing processes tend to produce minor surface damage along the scribe lines that are formed by the scribing equipment. For example, the process of rolling wheel 110 along the surface of layer 58 and the process of exposing the surface of layer 58 to laser light 124 along scribe line 130 tend to produce shallow surface damage such as surface damage 132 of FIG. 10 (i.e., a scribe-damaged surface region such as a wheel-scribed surface region or a laser-scribed surface region). When viewed from the side as shown in FIG. 10, surface damage 132 will penetrate into layer 58 only a relatively shallow distance W relative to the thickness T of layer 58.

The edges of layers 58 and 56 may be polished prior to removal of portion 58' of layer 58. Polishing equipment such as a grinding tool with a rotating grinding head that travels around the peripheral edge of display 14 may be used to polish the edges. With this type of arrangement, layers 58 and 56 are attached during the polishing process, so the polishing head will polish thin-film transistor layer peripheral edge 58E in alignment with color filter layer peripheral edge 56E.

The presence of portion 58' during polishing may help ensure that the polishing process proceeds evenly across the portion of edge 56E (i.e., portion 136 of color filter layer edge 56E adjacent to portion 58' will be polished identically to adjacent portions 134 of color filter layer edge 56E). In the absence of portion 58' during polishing, there is a potential for portion 136 of edge 56E to exhibit more chips or other imperfections than adjacent regions 134 (i.e., regions 136 and 134 would not have identically polished surfaces, because region 136 would be more damaged than regions 134). When portion 58' is present during polishing, however, color filter layer edge region 134 and 136 will have matched (identically polished) surfaces, even though region 136 is adjacent to notch 84 and region 134 is not adjacent to notch 84 in the finished display.

Figure 11:
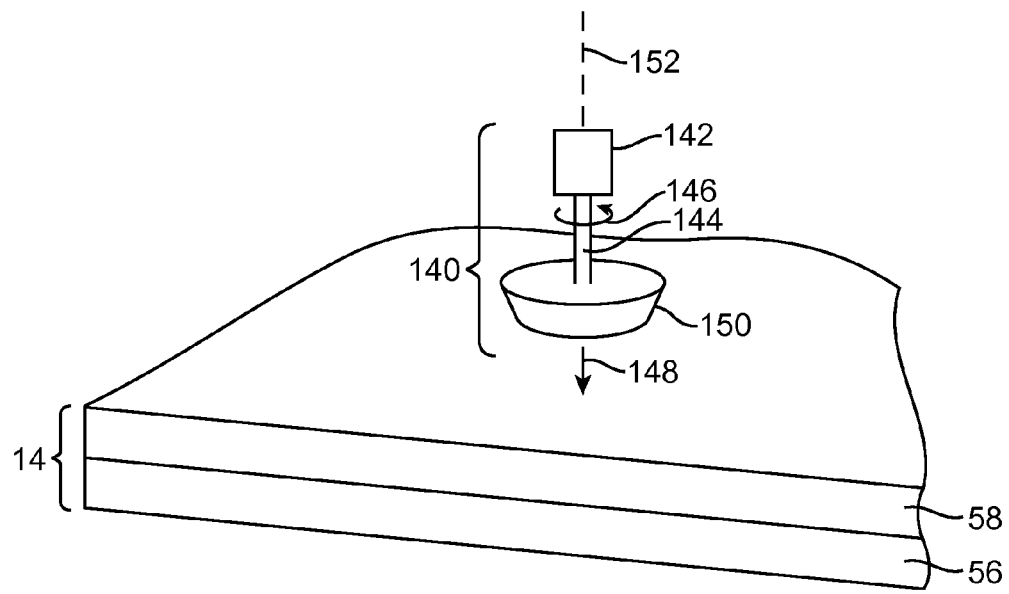
FIG. 11 is a perspective view of a display panel and an adjacent rotating grinding bit for forming a window opening in accordance with an embodiment of the present invention.

If desired, camera window opening 84 may have the shape of a hole in one or more of the layers of display 14. As shown in FIG. 11, grinding tool 140 may include motor system 142. Motor system 142 rotates shaft 144 and grinding bit 150 in direction 146 about rotational axis 152. When it is desired to grind a hole in layer 58, motor system 142 may move rotating grinding bit 150 in direction 148 towards layer 58.

Figure 12:
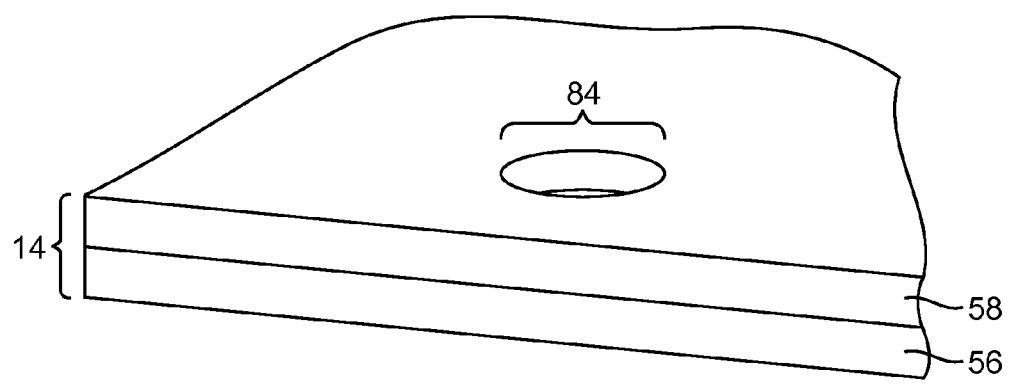
FIG. 12 is a perspective view of the display panel of FIG. 11 following formation of a ground hole using the equipment of FIG. 11 in accordance with an embodiment of the present invention.

Following grinding of hole 84 to a desired depth into display 14, hole 84 may appear as shown in FIG. 12 (i.e., hole 84 may form a recess in display 14 to accommodate camera 86). During subsequent assembly operations, camera 86 may be mounted within opening 84 (e.g., using adhesive 100 or other attachment mechanism).

Figure 13:
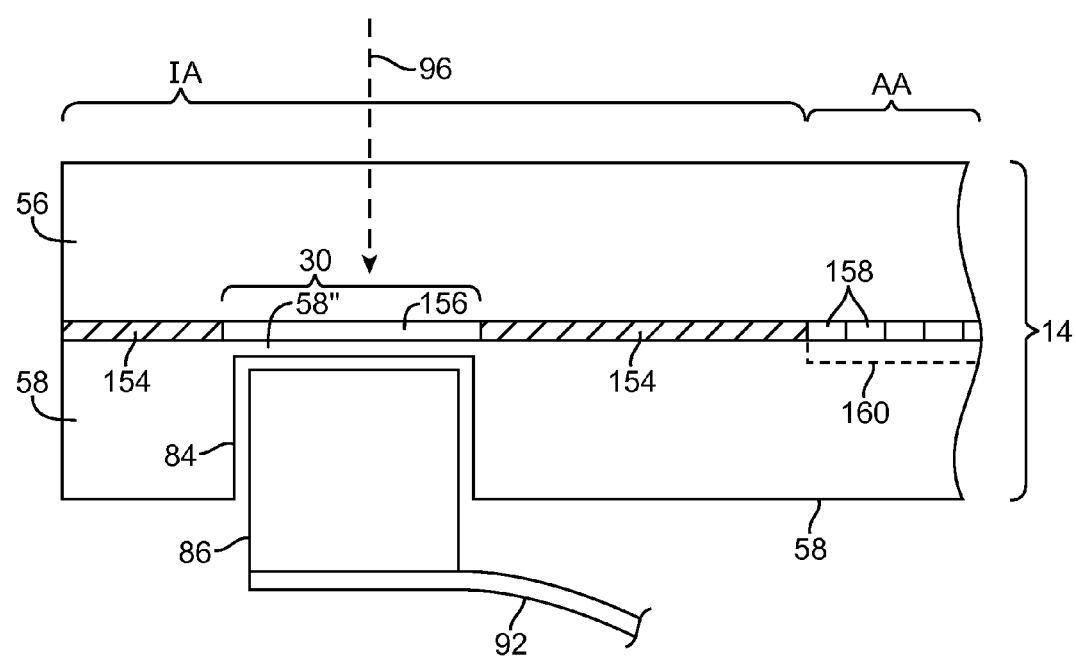
FIG. 13 is a cross-sectional side view of a display panel in which an opening has been formed through part of a thin-film transistor layer in accordance with an embodiment of the present invention.

As shown in the cross-sectional side view of display 14 in FIG. 13, recess (opening) 84 may be formed to a depth into thin-film transistor layer 58 that penetrates only partly into thin-film transistor layer 58 and that does not pass through thin-film transistor layer 58. In this type of situation, a thin portion 58" of layer 58 remains above camera 86. During operation of camera 86, light 96 passes through layer 56 and portion 58" to reach camera 86.

Thin-film transistor circuitry 160 may be formed in active area AA on the surface of the glass substrate that is used in forming thin-film transistor layer 58. Color filter layer 56 may have a layer of color filter elements 158 in active area AA. Color filter elements 158 may be formed from colored polymers (e.g., red elements, blue elements, and green elements in an array pattern). Liquid crystal layer 52 (FIG. 5) is interposed between color filter layer 56 and thin-film transistor layer 58 in active area AA.

In inactive area IA, a layer of opaque masking material such as black ink is formed between color filter layer 56 and thin-film transistor layer 58. As shown in FIG. 13, for example, an opaque masking layer such as black ink 154 may coat the surface of color filter layer 56 in inactive border area IA. An opening such as opening 156 in black ink layer 154 may be aligned with camera window 30 and may allow light 96 to pass through black ink layer 154 to camera 86.

Figure 14:
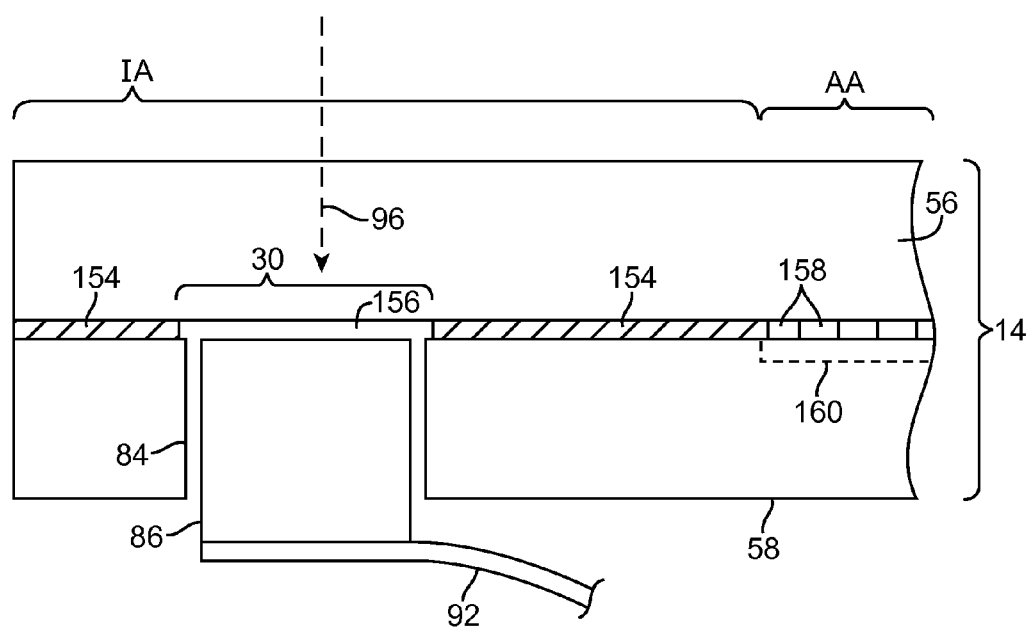
FIG. 14 is a cross-sectional side view of a display panel in which an opening has been formed through a thin-film transistor layer without penetrating into an overlapping color filter layer in accordance with an embodiment of the present invention.
Figure 15:
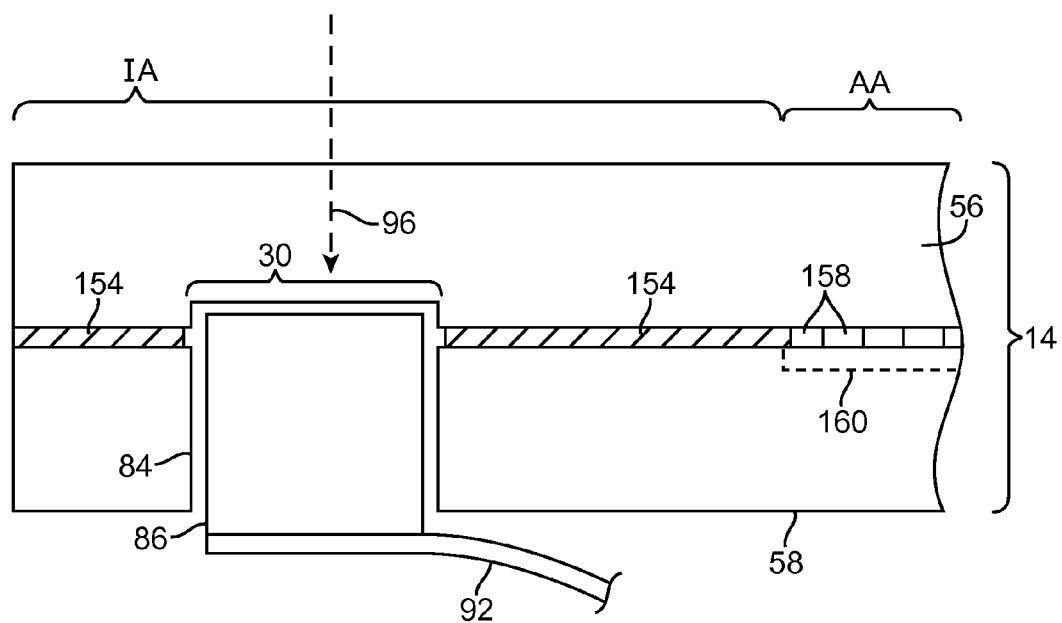
FIG. 15 is a cross-sectional side view of a display panel in which an opening has been formed that passes through a thin-film transistor layer and that penetrates partially into a color filter layer in accordance with an embodiment of the present invention.

In the configuration of FIG. 13, opening 84 penetrates sufficiently far into thin-film transistor layer 58 to form a recess that accommodates some or all of camera 86 without penetrating all of the way through layer 58 into opening region 156. If desired, opening 84 may pass through layer 58 without penetrating into layer 56, as shown in FIG. 14. FIG. 15 is a cross-sectional side view of display 14 in a configuration in which opening 84 forms a recess that passes through thin-film transistor substrate 58 and partially enters color filter layer substrate 56 without passing through color filter layer substrate 56.

Figure 16:
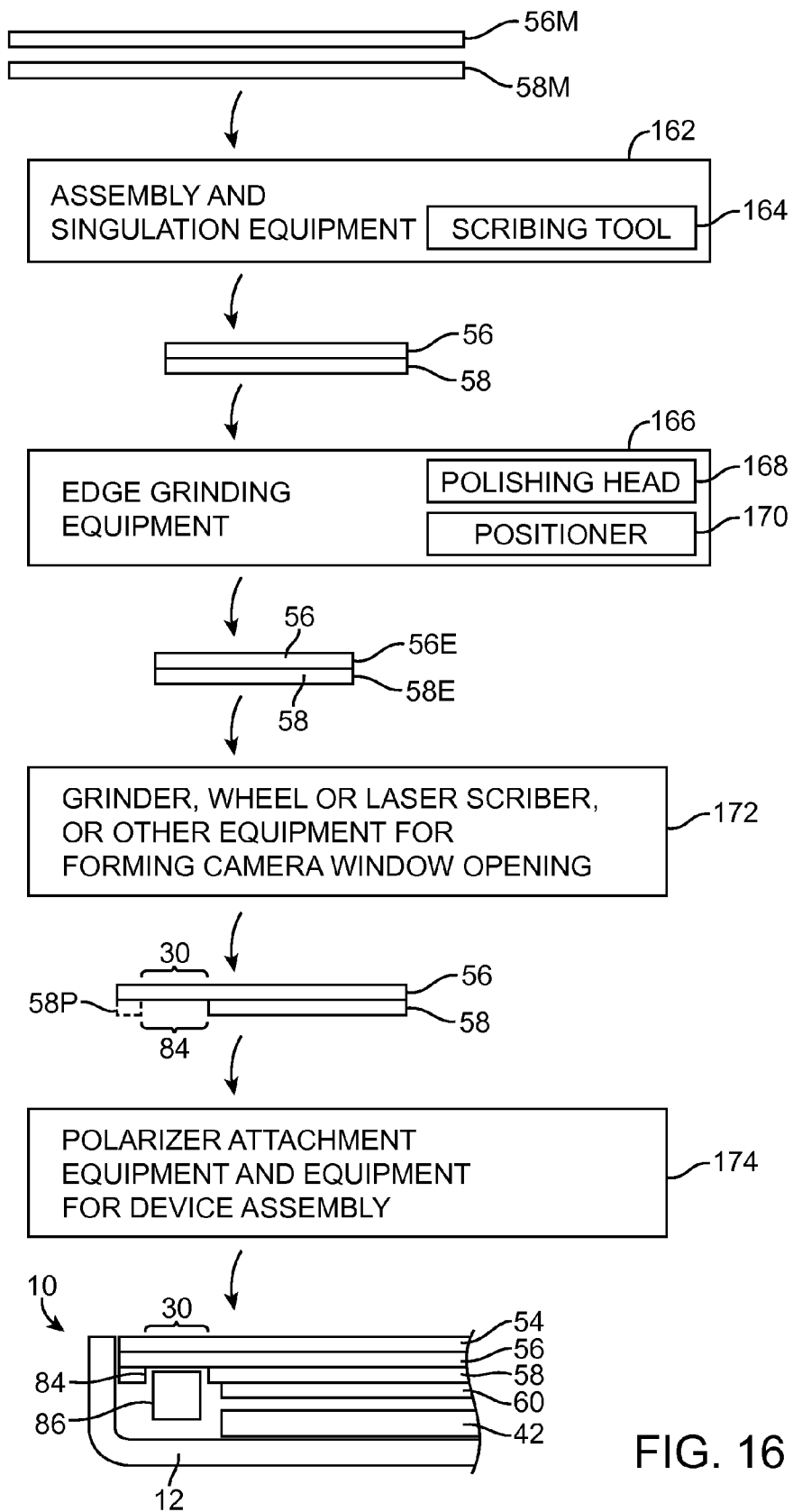
FIG. 16 is a diagram of equipment and methods used in forming displays with camera window openings in accordance with an embodiment of the present invention.

FIG. 16 shows systems and methods that may be used in forming device 10 with a display having a camera window formed by removing portions of the display. Initially, mother glass layers such as a color filter mother glass layer 56M and a thin-film transistor mother glass layer 58M may be assembled and divided into individual display panels using assembly and singulation equipment 162. Scribing tool 164 may be used in singulating mother glass layers (e.g., using scribe and break techniques). A liquid crystal layer 52 may be encapsulated between each singulated color filter layer 56 and singulated thin-film transistor layer 58.

The edges of the assembled singulated display layers that have been attached together using equipment 162 may be rough (unpolished). Accordingly, edge grinding equipment 166 may use positioner 170 to move rotating polishing head 168 along the peripheral edges of the display panel formed from the singulated color filter layer 56 and thin-film transistor layer 58. This polishing process forms a display panel structure with polished and aligned peripheral edges 56E and 58E, as described in connection with FIG. 10.

Following polishing, a grinder, scribing wheel, laser scribing equipment, or other equipment may be used to form camera window recess 84 in layer 58. Recess (opening) 84 may pass partly through layer 58, may pass through layer 58 without penetrating layer 56, or may pass through layer 58 and part of layer 56. Portion 58P of layer 58 may remain (e.g., when recess 84 forms a hole) or portion 58P of layer 58 may be removed as part of the scribe and break process to form a notch in layer 58 (i.e., a notch that extends in from the edge of layer 58 to form window 30).

Polarizer attachment equipment and equipment for assembling the structures of display 14 may be used to attach upper polarizer 54 to color filter layer 56 and may be used to attach lower polarizer 60 to thin-film transistor layer 58 after forming opening 84. Camera 86 may be mounted in opening 84 by equipment 174 and display 14 may be mounted in device housing 12 to form electronic device 10.

Figure 17:
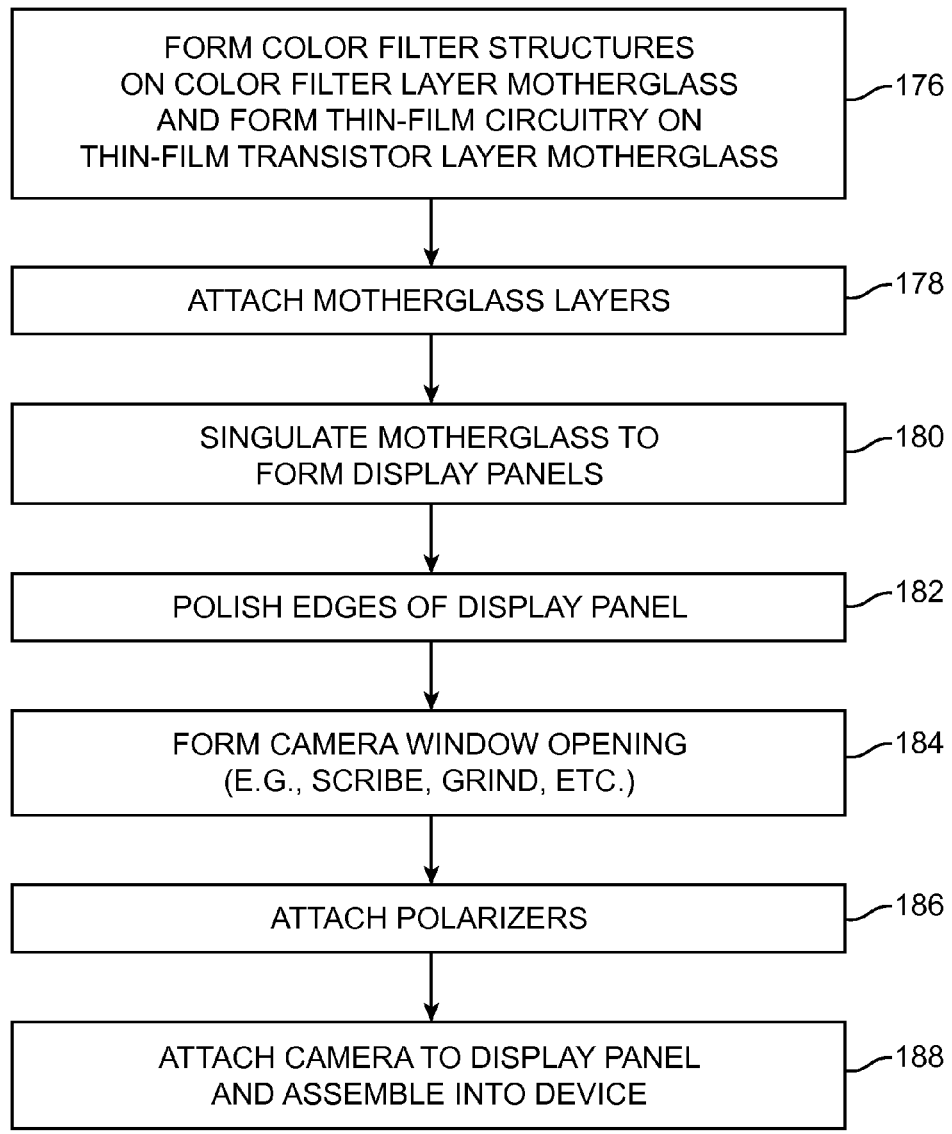
FIG. 17 is a flow chart of techniques involved in forming displays with camera window openings in accordance with an embodiment of the present invention.

Illustrative steps involved in forming an electronic device having a display with a camera window opening are shown in FIG. 17.

At step 176, color filter layer structures may be deposited and patterned on a glass substrate or other transparent substrate to form color filter layer 56. An opening such as opening 156 in opaque masking layer 154 is formed for camera windows 30. Opening 156 may be circular in shape, rectangular in shape, or may have other suitable shapes. Thin-film transistor circuitry is formed on a glass substrate or other transparent substrate to form thin-film transistor layer 58. The color filter layer and thin-film transistor layers may be formed as large panels (mother glass) during the operations of step 176.

At step 178, the mother glass layers (color filter mother glass and thin-film transistor mother glass) are attached to each other. Liquid crystal layer 52 is interposed between the mother glass layers. Sealant may be used to laterally confine liquid crystal layer 52.

At step 180, the mother glass layers are singulated into individual panels using equipment 162.

At step 182, the peripheral edge of the singulated display structures is polished using equipment 166 to create aligned thin-film transistor and color filter layer edges.

At step 184, a camera window recess is formed in each display panel. Scribing and breaking techniques may be used to remove a portion of thin-film transistor layer 58, thereby creating a notch along the edge of thin-film transistor layer 58 that can serve as camera window 30 or a notch may be formed using a grinding tool. If desired, grinding techniques may be used to form a ground hole in thin-film transistor layer 58 (and, if desired color filter layer 56).

At step 186, the upper and lower polarizers of display 14 may be attached to the display panel. The display panel to which the polarizers are attached may have polished edges and the recess forming camera window 30. Equipment such as equipment 174 of FIG. 16 may be used in attaching the polarizers. If desired, a portion of the upper polarizer in alignment with camera window 30 may be cut away or treated (e.g., using light, chemicals, etc.) to remove the polarizer material and thereby enhance camera performance.

At step 188, camera 86 may be attached to the display panel. For example, adhesive 100 may be used to attach camera 86 to the top of camera window opening 84. Adhesive 100 may attach camera 86 to the bottom of color filter layer 56 when opening 84 is a notch in the edge of thin-film transistor layer 58 as shown in FIG. 10, may attach camera 86 to portion 58" of thin-film transistor layer 58 at the top of opening 84 when opening 84 is a ground hole of the type shown in FIG. 13, may attach camera 86 to the bottom of color filter layer 56 in configurations of the type shown in FIG. 14 in which opening 84 passes through thin-film transistor layer 58 without penetrating color filter layer 56, or may attach camera 86 to the surface of color filter layer 56 that is exposed in a configuration of the type shown in FIG. 15 in which opening 84 partially penetrates into color filter layer 56.

At step 188, backlight 42 and other portions of display 14 and camera 86 may be assembled into electronic device housing 12 to form electronic device 10, as shown at the bottom of FIG. 16.

The foregoing is merely illustrative of the principles of this invention and various modifications can be made by those skilled in the art without departing from the scope and spirit of the invention.

What is claimed is:

1. A display, comprising:
 a thin-film transistor layer having first and second opposing surfaces, a first peripheral edge, and a notch that extends at least partly into the first peripheral edge to form a recessed edge of the thin-film transistor layer, wherein the thin-film transistor layer includes an unpolished portion along the recessed edge, and wherein the first peripheral edge comprises a polished portion that extends from the first surface to the second surface;
 a camera mounted within the notch; and
 a color filter layer that overlaps the notch and the camera, wherein the color filter layer comprises a second peripheral edge that is aligned with the first peripheral edge.

2. The display defined in claim 1 wherein the color filter layer has an active area and an inactive area, wherein the inactive area includes an opaque black masking layer with an opening that is aligned with the camera.

3. The display defined in claim 2 wherein the notch has a shape defined by a scribe line on the thin-film transistor layer, wherein the thin-film transistor layer includes a scribe-damaged surface region along the scribe line.

4. The display defined in claim 3 wherein the scribe-damaged surface region comprises a laser-scribed surface region.

5. The display defined in claim 3 wherein the scribe-damaged surface region comprises a wheel-scribed surface region.

6. The display defined in claim 1 wherein the color filter layer has an active area with an array of color filter elements and an inactive area with an opaque masking layer, wherein the opaque masking layer has an opening and wherein the opening in the opaque masking layer is aligned with the notch and the camera so that light passes through the opening in the opaque masking layer into the camera.

7. The display defined in claim 6 further comprising a layer of adhesive that attaches the camera to the color filter layer.

8. The display defined in claim 7 wherein the color filter layer has a polished edge and wherein a region of the color filter layer adjacent to the notch and a region of the color filter layer that is not adjacent to the notch have matched polished surfaces.

9. A display, comprising:
- a color filter layer;
- a thin-film transistor layer;
- a hole that penetrates partly into the thin-film transistor layer;
- a camera having a housing with a surface in which a lens is mounted, wherein a portion of the color filter layer and a portion of thin-film transistor layer extend over the lens of the camera, and wherein the camera is mounted in the hole so that light is received by the camera through the portion of the color filter layer that overlaps the camera and through the portion of the thin-film transistor layer that overlaps the camera; and
- adhesive that attaches the surface of the housing in which the lens is mounted to the portion of the thin-film transistor layer that overlaps the camera.

10. The display defined in claim 9 further comprising:
- liquid crystal material interposed between a portion of the color filter layer and the thin-film transistor layer; and
- an opaque masking layer on a border region of the color filter layer, wherein the opaque masking layer has an opening that is aligned with the hole so that light passes through the opening into the camera.

11. The display defined in claim 10 further comprising a flexible printed circuit attached to the camera.

12. The display defined in claim 10 further comprising first and second polarizers, wherein the color filter layer and the thin-film transistor layer are interposed between the first and second polarizers.

13. The display defined in claim 9 wherein the color filter layer and the thin-film transistor layer have aligned polished edges.

14. A display, comprising:
- a color filter layer;
- a thin-film transistor layer;
- a hole that penetrates through the thin-film transistor layer and partly into the color filter layer;
- a camera mounted in the hole so that light is received by the camera through a portion of the color filter layer that extends over the camera; and
- adhesive in the hole that attaches the camera to the portion of the color filter layer that extends over the camera.

15. The display defined in claim 14 further comprising:
- an opaque masking layer on a portion of the color filter layer, wherein the opaque masking layer has an opening that is aligned with the hole so that light passes through the opening into the camera.

16. The display defined in claim 14 wherein the color filter layer comprises glass and wherein the hole comprises a ground hole.

17. The display defined in claim 16 further comprising first and second polarizers, wherein the color filter layer and the thin-film transistor layer are interposed between the first and second polarizers.

18. The display defined in claim 14 wherein the color filter layer and the thin-film transistor layer have aligned polished edges.

* * * * *